(12) United States Patent
Okura et al.

(10) Patent No.: US 6,803,667 B2
(45) Date of Patent: Oct. 12, 2004

(54) SEMICONDUCTOR DEVICE HAVING A PROTECTIVE FILM

(75) Inventors: Yasushi Okura, Toyokawa (JP); Kuniaki Mamitsu, Okazaki (JP); Naohiko Hirano, Okazaki (JP)

(73) Assignee: Denso Corporation, Kariya (JP)

(*) Notice: Subject to any disclaimer, the term of this patent is extended or adjusted under 35 U.S.C. 154(b) by 36 days.

(21) Appl. No.: 10/211,246

(22) Filed: Aug. 5, 2002

(65) Prior Publication Data

US 2003/0052400 A1 Mar. 20, 2003

(30) Foreign Application Priority Data

Aug. 9, 2001  (JP) ........................................ 2001-242077

(51) Int. Cl.$^7$ .................. H01L 23/28; H01L 23/29; H01L 23/48; H01L 23/52
(52) U.S. Cl. .................. 257/792; 257/787; 257/690; 257/675; 257/666; 257/706; 257/707; 257/712; 257/713; 257/692; 257/782; 257/783
(58) Field of Search ........................... 257/692, 787, 257/690, 666, 675, 712, 713, 706, 707, 782, 783, 792

(56) References Cited

U.S. PATENT DOCUMENTS 5,757,081 A * 5/1998 Chang et al. ............... 257/778

6,028,348 A * 2/2000 Hill ............................ 257/666
6,486,563 B1 * 11/2002 Lin ............................. 257/778

OTHER PUBLICATIONS

U.S. patent application Ser. No. 10/201,556, Hirano et al., filed Jul. 24, 2002.
U.S. patent application Ser. No. 09/717,227, Mamitsu, filed Nov. 22, 2000.
U.S. patent application Ser. No. 10/127,613, Teshima, filed Apr. 25, 2002.
U.S. patent application Ser. No. 10/321,365, Teshima et al., filed Dec. 18, 2002.

* cited by examiner

Primary Examiner—Nitin Parekh
(74) Attorney, Agent, or Firm—Posz & Bethards, PLC

(57) ABSTRACT

A semiconductor device comprises a semiconductor element, a heat sink soldered to one surface of the semiconductor element, and a heat sink soldered to an opposite surface of the semiconductor element. The semiconductor element is provided with a wiring layer. The wiring layer is covered with an insulating protective film. The protective film is an organic film. The thickness of the wiring layer and that of the protective film are assumed to be t1 and t2, respectively. The wiring layer and the protective film are formed so as to establish a relationship of t1<t2. An elastic modulus of the protective film at room temperature is adjusted to 1.0–5.0 GPa and a thermal expansion coefficient of the protective film is adjusted to $35$–$65 \times 10^{-6}/°$ C. Even under a thermal stress the semiconductor device can diminish a short-circuit defect of the wiring layer.

38 Claims, 9 Drawing Sheets

SEMICONDUCTOR DEVICE HAVING A PROTECTIVE FILM

CROSS REFERENCE TO RELATED APPLICATION

This application is based on Japanese Patent Application No. 2001-242077 filed on Aug. 9, 2001 the contents of which are incorporated herein by reference.

BACKGROUND OF THE INVENTION

1. Field of the Invention

The present invention relates to a semiconductor device comprising a semiconductor element and a metal block, e.g., a heat sink, which is bonded to electrode surfaces of the semiconductor element through an electrically conductive bonding material.

2. Description of Related Art

For example, a semiconductor chip (semiconductor element) in a power semiconductor device (e.g., IGBT, MOSFET, or a power IC including them) for a high withstand voltage and a high current generates a great deal of heat while it is in use. Therefore, the semiconductor chip is required to have a construction for improving its heat radiating property. For example, a heat sink is useful for meeting this requirement. The heat sink can be bonded to the semiconductor chip through a solder layer.

Since such a semiconductor device is used in a wide temperature range, it is necessary to prevent its failure induced by thermal stress.

SUMMARY OF THE INVENTION

It is an object of the present invention to provide a semiconductor device which can prevent a large deformation of a protective film even when subjected to a large thermal stress, thereby making it possible to diminish short-circuit of an electrode layer.

Having conducted trial manufacture and experiments, the inventors in the present case found out a condition capable of preventing a large deformation of an organic type protective film and thereby capable of diminishing a short-circuit defect of an electrode layer when a large thermal stress is applied to the semiconductor device of the above construction. This condition is expressed as t1<t2 wherein t1 stands for the thickness of the electrode layer, here the electrode layer covered with the protective film, and t2 stands for a substantial thickness of the protective film. Under this thickness condition, even if the protective film is deformed by a thermal stress, it is possible to prevent a shoulder portion of the electrode layer from breaking the protective film and being exposed.

We have confirmed that the protective film preferably has an elastic modulus at room temperature of 1.0–5.0 GPa and a thermal expansion coefficient of 35–65×10$^{-6}$/° C.

It is preferable that the elastic modulus of the protective film be smaller than that of the bonding material so as to absorb strains induced by a thermal expansion of the electrically conductive material and that of the semiconductor chip. Further, in order to prevent an excessive deformation of the protective film it is preferable that the thermal expansion coefficient of the protective film be almost equal to that of the bonding material. For example, in case of using an Sn-based solder as the bonding material, its thermal expansion coefficient is 30×10$^{-6}$/° C. or so and it is desirable to select one having a thermal expansion coefficient in the range of 35–65×10$^{-6}$/° C. as noted above.

By thus selecting appropriate elastic modulus and thermal expansion coefficient of the protective film, even if a large thermal stress is applied thereto, the protective film can withstand the thermal stress and is prevented from being largely deformed. As a result, a short-circuit defect of the electrode layer can be diminished.

If an Sn-based solder is used as the bonding material, and given that a thermal expansion coefficient of a metal block (heat sink) on the surface side of the semiconductor element is $\alpha 1$, that of the semiconductor element is $\alpha 2$, the chip size of the semiconductor element is a×b, and a temperature difference between highest and lowest temperatures in a working environment is $\Delta T$, it is desirable to construct the semiconductor device so that the following relationship is established:

$$t1 < t2 \leq \frac{1}{2} \times \sqrt{a^2 + b^2} \times |\alpha 1 - \alpha 2| \times \Delta T$$

Further, in the case of a construction wherein a metal block (heat sink) is disposed also on the back side of the semiconductor element, and given that an apparent thermal expansion coefficient of a composite system comprising the surface-side metal block (heat sink) of the semiconductor element and solder is $\alpha 1e$, that of a composite system comprising the back-side metal block (heat sink) and the semiconductor element is $\alpha 2e$, the chip size of the semiconductor element is a×b, and a temperature difference between highest and lowest temperatures in the working environment is $\Delta T$, it is desirable to construct the semiconductor device so that the following relationship is established:

$$\frac{1}{2} \times \sqrt{a^2 + b^2} \times |\alpha 1e - \alpha 2e| \times \Delta T \leq t2$$

Through trial manufacture and experiments we have confirmed that even if a large thermal stress is induced due to a difference in thermal expansion coefficient between the semiconductor element and the metal block (heat sink), it is possible to diminish a short-circuit defect of the electrode layer if a surface asperity of the ground for the bonding material which bonds the metal block to the semiconductor element is flat or is concave above the electrode layer.

BRIEF DESCRIPTION OF THE DRAWINGS

Features and advantages of embodiments will be appreciated, as well as methods of operation and the function of the related parts, from a study of the following detailed description, the appended claims, and the drawings, all of which form a part of this application. In the drawings:

DETAILED DESCRIPTION OF PREFERRED EMBODIMENTS

Reference will first be made to a comparative example which the inventors in the present case have studied. We have actually fabricated and evaluated a semiconductor device provided with two heat sinks respectively on both sides of a semiconductor chip. This construction affords a high heat radiating performance because heat can be radiated through the heat sinks from both sides of the semiconductor chip.

As a result of a temperature cycle test we found that there occurred a malfunction of the semiconductor device at a small number of cycles. The temperature cycle test is a test in which a heat cycle in the temperature range of for example −50° C. to 150° C. is exerted on the semiconductor device repeatedly. As a result of the test it turned out that the semiconductor device failed due to short-circuit of wiring layers (gate runners) with surface-side main electrodes (emitters), the wiring layers being an electrode as wiring of a gate formed on the surface of the semiconductor chip (e.g., IGBT chip).

Figure 12:
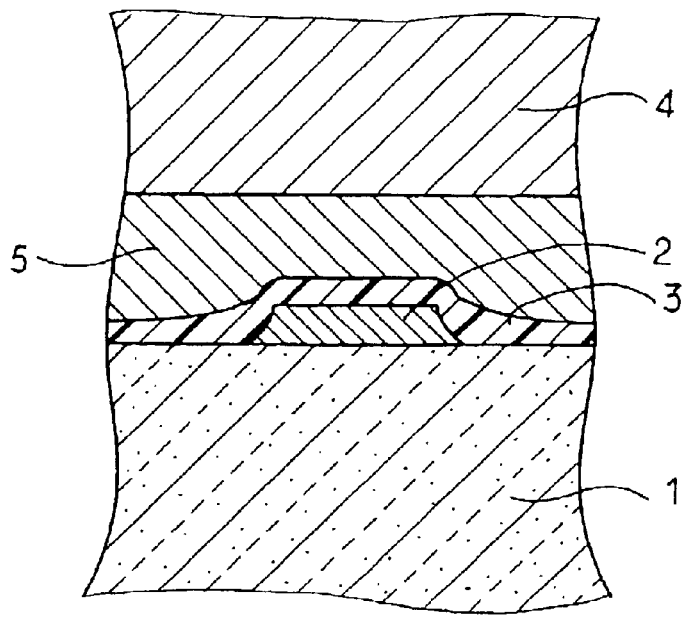
FIG. 12 is a partial enlarged sectional view of a semiconductor chip according to a comparative example.

In this connection, we have investigated in detail the cause of the short-circuit of the surface gate wiring layer in the semiconductor chip. FIG. 12 shows a normal state of a construction wherein a heat sink is soldered to the surface of a semiconductor chip. As shown in the same figure, we have fabricated a semiconductor chip wherein for example an Al wiring layer (gate runner) 2 for gate is formed on the surface of the semiconductor chip indicated at 1 and an insulating protective film is formed so as to cover the wiring layer 2. The protective film is an organic protective film 3. For example a heat sink block 4 as a heat sink was bonded onto the protective film 3 through solder 5. In this construction, the wiring layer 2 and the solder 5 (and hence the heat sink block 4) are insulated from each other through the protective film 3. The protective film 3 is formed of a polyimide resin for example.

Figure 13:
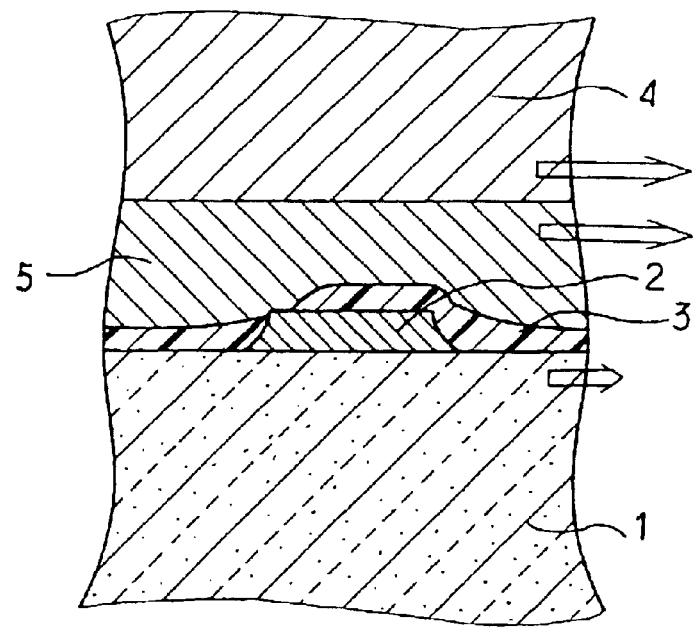
FIG. 13 is a partial enlarged sectional view of the comparative semiconductor chip, showing a state in which a gate short-circuit defect has occurred.

A heat cycle is applied to the semiconductor device of the above construction while assuming an actual working environment. There is a fairly wide difference between the thermal expansion coefficient of the semiconductor chip 1 (e.g., a thermal expansion coefficient of Si is $4.2 \times 10^{-6}/°$ C.) and that of the heat sink block 4 (e.g., a thermal expansion coefficient of Cu is $17 \times 10^{-6}/°$ C.), so there arises a large thermal stress. Thus, as shown in FIG. 13, there is a fear that the protective film 3 may be deformed, with consequent contact of the wiring layer 2 with the solder 5, causing a short-circuit. In the same figure, the length of each arrow represents the magnitude of displacement, while the direction of each arrow represents the direction of displacement (toward the center of the chip 1 in the illustrated example).

Thus, we have found out that the reason why the gate wiring layer 2 on the surface of the semiconductor chip 1 shorts upon exertion of a heat cycle to the semiconductor device is because a large thermal stress is induced due to a difference in thermal expansion coefficient between the semiconductor chip 1 and the heat sink block 4 and a large deformation of the protective film 3 results. On the basis of these evaluations and analyses we have conducted the following embodiments.

A first embodiment of the present invention will be described below with reference to FIGS. 1 to 9, in which the same portions as in the comparative example illustrated in FIG. 12 are identified by like reference numerals.

Figure 4:
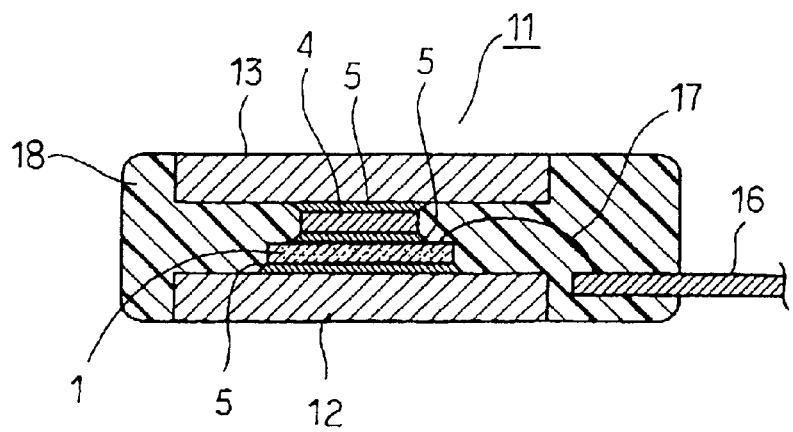
FIG. 4 is a vertical sectional view of the semiconductor device having a double-side heat radiating structure according to the first embodiment.
Figure 6:
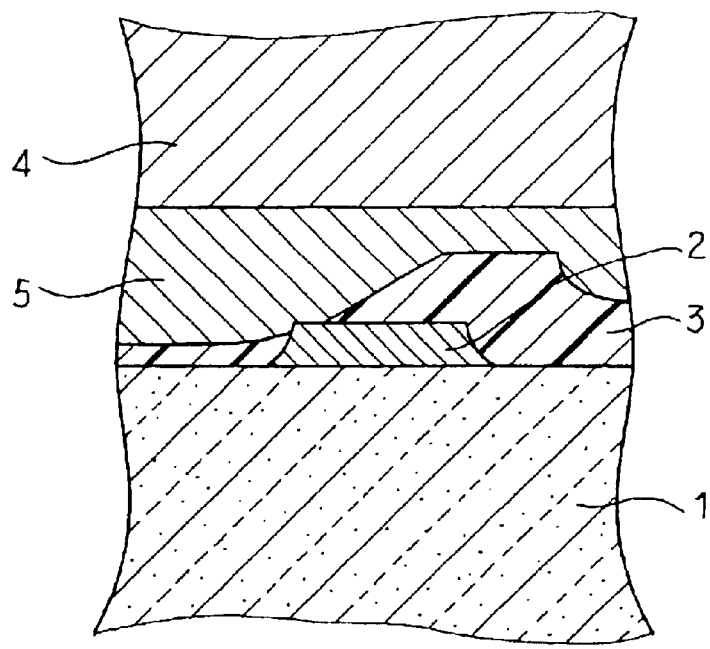
FIG. 6 is a partial enlarged sectional view of the semiconductor chip, showing a state in which a gate short-circuit defect has occurred.

FIG. 4 is a vertical sectional view showing schematically an entire configuration of a semiconductor device 11 according to this first embodiment. As shown in the same figure, the semiconductor device 11 of this embodiment is provided with a semiconductor chip (semiconductor element) 1, an upper heat sink 13 and a heat sink block 4 (a first metal block), and a lower heat sink (a second metal block) 12.

Figure 5A:
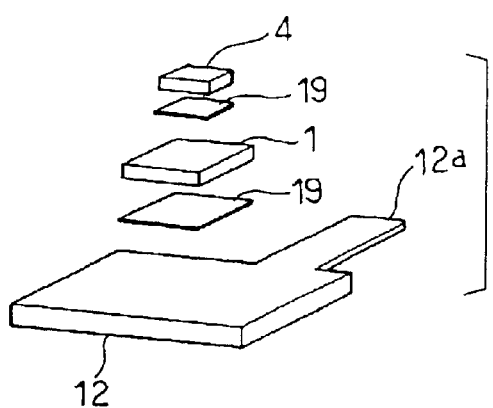
FIGS. 5A, 5B, 5C, 5D, and 5E are perspective views showing a semiconductor device manufacturing process according to the first embodiment.

The semiconductor chip 1 is constituted by a vertical type power semiconductor element such as, for example, IGBT or a thyristor. In this embodiment, as shown in FIG. 5A, the semiconductor chip 1 is in the form of a thin rectangular plate. The lower heat sink 12, upper heat sink 13 and heat sink block 4 are constructed of a metal high in thermal conductivity and electrical conductivity, e.g., Cu or Al. As shown in FIG. 5A, the heat sink block 4 is a rectangular plate which is a size smaller than the semiconductor chip 1.

Figure 5D:
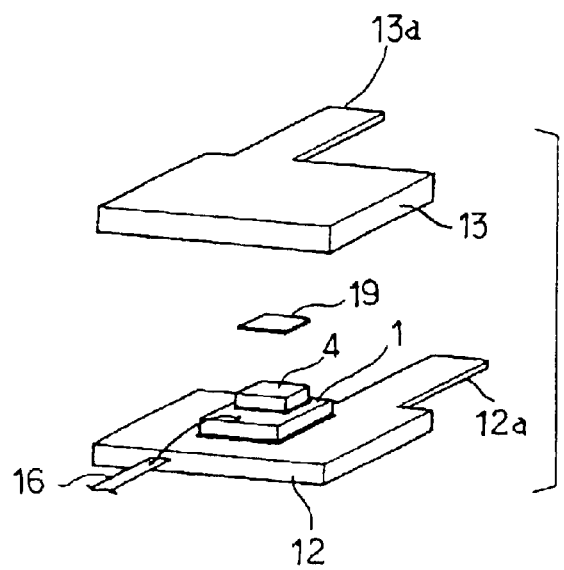

The lower heat sink 12, as shown in FIG. 5A, is for example a generally rectangular plate as a whole and a terminal portion 12a is projected so as to extend backward. Further, as shown in FIG. 5D, the upper heat sink 13 is for example a generally rectangular plate as a whole with a terminal portion 13a being projected so as to extend backward.

As shown in FIG. 4, the semiconductor chip 1 is bonded onto the lower heat sink 12 through, for example, solder 5 which is a bonding material. Further, the upper heat sink 13 is bonded onto the heat sink block 4 through, for example, solder 5 as a bonding material. A layer thickness of each solder 5 is set at 100–200 μm.

Figure 2:
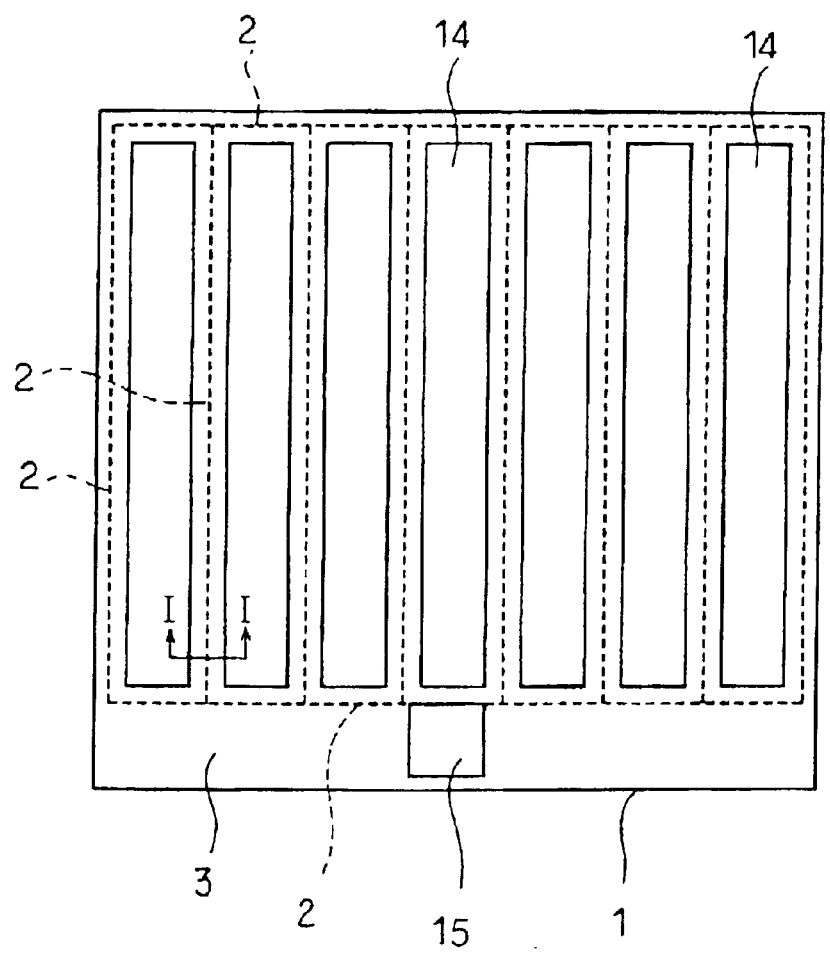
FIG. 2 is a plan view showing an upper surface of the semiconductor chip according to the first embodiment.

An upper surface of the semiconductor chip 1 is shown in FIG. 2. As shown in the same figure, plural, for example seven, emitter electrodes (emitter pads) 14 are formed on the upper surface of the semiconductor chip 1 correspondingly to positions where the heat sink block 4 is bonded. The emitter electrodes 14 are second electrodes on the semiconductor chip 1. For example one gate electrode (gate pad) 15 is provided correspondingly to a position where the heat sink block 4 is not bonded. The seven emitter electrodes 14 are connected in common to the solder 5. The solder 5 is connected to the heat sink block 4 and further to the upper heat sink 13. Therefore, the seven emitter electrodes 14 are connected to the upper heat sink 13. As shown in FIG. 5C, the gate electrode 15 is wire-bonded to a lead frame 16 through wire 17.

On the other hand, a collector electrode (not shown) is formed throughout the whole of a lower surface of the semiconductor chip 1 and is connected to the lower heat sink 12 through solder 5.

The terminal portions 12a and 13a of the lower and upper heat sinks 12, 13, respectively, are positioned so as to be offset each other, that is, so as not to be opposed to each other. In this construction, the distance between an upper surface of the lower heat sink 12 and a lower surface of the upper heat sink 13 is set at for example 1–2 mm or so.

As shown in FIG. 4, resin (e.g., epoxy resin) 18 is molded into the gap between the pair of heat sinks 12 and 13 and also into the surrounding portions of the semiconductor chip 1 and heat sink block 4.

Thus, the semiconductor chip 1 is held grippingly from above and below by the heat sinks 12, 13 and heat sink block 4. The semiconductor chip 1 is integrally molded with the resin 18. Further, the chip 1 is cooled through the heat sinks 12, 13 and heat sink block 4. The lower heat sink 12 and the upper heat sink 13 are connected also electrically through solder 5 to main electrodes (e.g., collector or emitter electrodes) which are formed on the lower and upper surfaces of the semiconductor chip 1. Though not shown in FIG. 4, the terminal portions 12a and 13a of the heat sinks 12, 13 project from the sealing resin and constitute collector and emitter terminals of the semiconductor device 11.

A polyamide resin (not shown) is applied to the surfaces of the heat sinks 12, 13 and the surrounding portions (end face portions) of the semiconductor chip 1 and heat sink block 4. The polyamide resin strengthens the adhesion between the resin 18 and the heat sinks 12, 13, the adhesion between the resin 18 and the chip 1, and the adhesion between the resin 18 and the heat sink block 4.

The lead frame 16 wire-bonded to the gate electrode 15, etc. on the semiconductor chip 1 is also molded with the resin 18. It is preferable that the polyamide resin be also applied to surfaces of the lead frame 16 and the wire 17.

Figure 1:
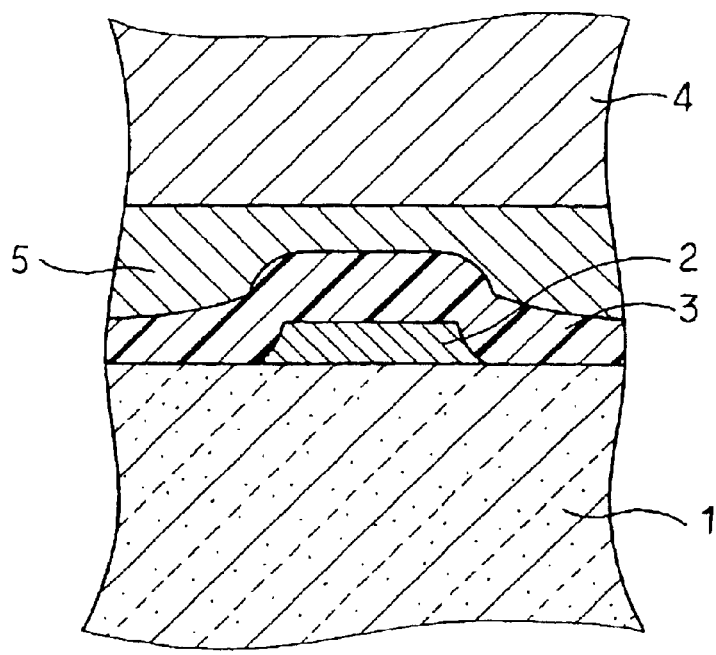
FIG. 1 is a partial enlarged sectional view of a semiconductor chip according to a first embodiment of the present invention, taken along line I—I in FIG. 2.

Next, with reference to FIGS. 1 and 2, the following description is now provided about the surface structure of the semiconductor chip 1. As shown in FIG. 2, the emitter electrodes 14 and the gate electrode 15 are formed on the surface of the semiconductor chip 1. The other surface portion of the semiconductor chip 1 than the emitter electrodes 14 and gate electrode 15 is covered and insulated with the organic protective film 3. For example, the protective film 3 is a polyimide resin film.

A wiring layer (gate runner) 2 is formed between and around emitter electrodes 14 on the surface of the semiconductor chip 1, as indicated with broken lines in FIG. 2. The wiring layer 2, which is made of aluminum, is for the control of gate. The wiring layer 2 is a first electrode layer on the semiconductor chip 1 and is covered with the protective film 3.

FIG. 1 illustrates a vertical sectional structure of the wiring layer 2 in which the heat sink block 4 is bonded to the surface of the semiconductor chip 1 through solder 5.

As shown in FIG. 1, the gate wiring layer 2 is formed on the surface of the semiconductor chip 1. The protective film 3 is formed so as to cover the wiring layer 2. The heat sink block 4 is bonded onto the protective film 3 through solder 5. The protective film provides an electrical insulation between the wiring layer 2 and the solder 5 (and further the heat sink block 4).

It is here assumed that the thickness of the wiring layer 2 is t1 ($\mu$m) and that of the protective layer 3 is t2 ($\mu$m). This embodiment is constructed so that there exists a relationship of t1<t2. For example, the thickness of the wiring layer 2 is set at 5 $\mu$m and that of the protective film 3 is set at 6 $\mu$m.

The protective film has an elastic modulus at room temperature of 1.0 to 5.0 GPa and a thermal expansion coefficient of 35–65×10$^{-6}$/° C. It is preferable that the protective film 3 when applied have a viscosity of 10 Pa·s or more.

Figure 3:
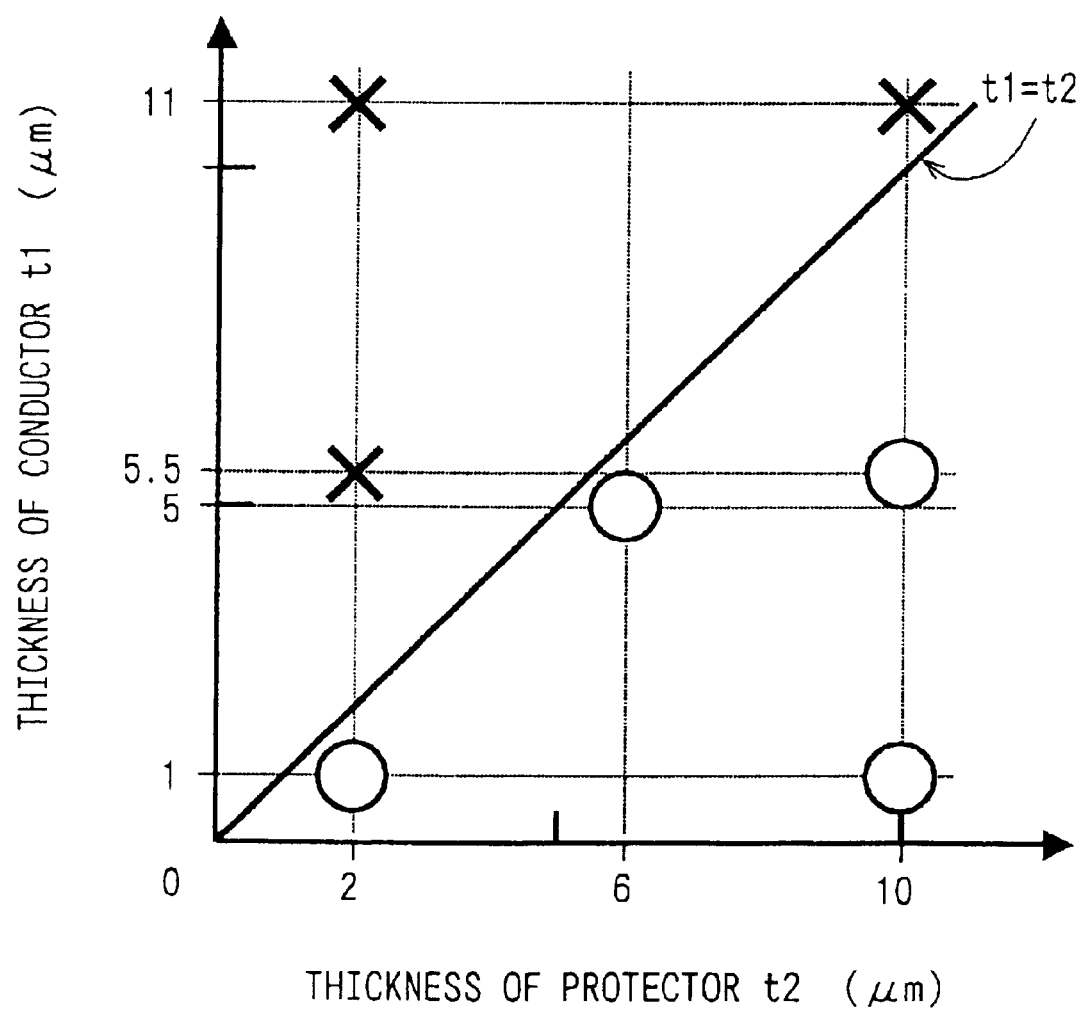
FIG. 3 is a graph showing the result of a durability test.

FIG. 3 shows the result of trial manufacture and experiment conducted by us. We have trial-manufactured plural semiconductor devices while changing the thickness t1 of the wiring layer 2 and the thickness t2 up to the surface of the protective film 3. These trial products are of the same double-side heat radiating type as in FIG. 4. In the trial products, the size t1 indicates the height of a stepped portion formed convexly by a peripheral edge portion of the wiring layer 2 with respect to the peripheral portion or the wiring layer. The protective film used in this experiment is a polyimide film having an elastic modulus of 3.0 GPa and a thermal expansion coefficient of 50×10$^{-6}$/° C. The size t2 indicates the height of the protective film 3 with respect to the peripheral portion of the wiring layer 2. For the trial products we have conducted a temperature cycle test in which a temperature cycle in a temperature range of –50° C. to 150° C. is exerted on the trial products repeatedly. After 2000 cycles we checked electrical characteristics of each trial product. In FIG. 3, circle marks indicate sizes at which all of the plural trial products were found to be good after the temperature cycle test, while cross marks indicate sizes at which at least one of the plural trial products was defective. FIG. 3 shows that in the area which satisfies the relationship of t1<t2 there are obtained good products without exception.

We have observed sections of the trial products after the temperature cycle test and found that the trial products satisfying the relationship of t1<t2 are prevented from a large deformation of the protective film 3 even after exertion thereon of a thermal stress and that a short-circuit defect of the wiring layer 2 can be prevented in a substantially positive manner.

An explanation will now be made about the reason why the elastic modulus and thermal expansion coefficient of the protective film 3 are set as above in addition to defining the thickness t2 of the protective film so as to become larger in terms of the above conditional expression. By merely setting large the thickness t2 of the protective film 3 there is a fear that the protective film 3 may be deformed as in FIG. 6 when a large thermal stress is applied thereto. If the protective film 3 is deformed as in FIG. 6, there will occur a short-circuit of the wiring layer 2 with the solder 5. Therefore, it is necessary for the protective film to be deformable (displaceable) almost equally to the solder 5 and have a strength high enough to withstand the deformation. For this reason the elastic modulus and thermal expansion coefficient of the protective film 3 have been set as above.

It is preferable that the elastic modulus of the protective film 3 be smaller than that of the solder 5. This is because a strain caused by thermal expansion of the solder 5 and silicon (semiconductor chip) 1 is to be absorbed. It is preferable that the thermal expansion coefficient of the protective film 3 be set almost equal to that of the solder 5. The reason is that an excessive deformation of the protective film 3 is to be prevented. For example, a thermal expansion coefficient of an Sn-based solder is about 30×10$^{-6}$/° C. By such settings it is possible to prevent the protective film 3 from being largely deformed and hence possible to prevent a short-circuit defect of the wiring layer 2 in a nearly positive manner. In this embodiment, an Sn-based solder material was used as the solder 5. The construction of this embodiment is effective particularly for an Sn-based solder material.

We have confirmed that a short-circuit defect of the wiring layer 2 can be prevented in a substantially positive manner by setting the elastic modulus and thermal expansion coefficient of the protective film 3 as above and by setting the sizes of the protective film 3 and the wiring layer 2 at t1<t2.

Next, with reference to FIGS. 5 and 4, a brief description will be given below about a method (i.e., a manufacturing process) for manufacturing the semiconductor device constructed as above.

Figure 5B:
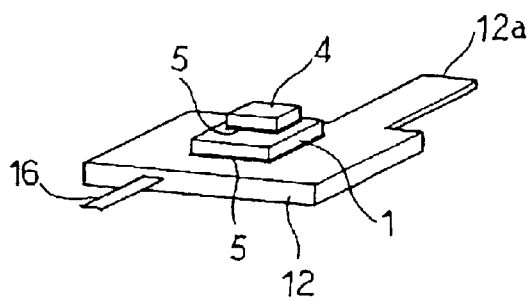

First, as shown in FIGS. 5A and 5B, the semiconductor chip 1 and the heat sink block 4 are connected and fixed with solder to the upper surface of the lower heat sink 12. In this step, first the chip 1 is placed on the upper surface of the lower heat sink 12 through a solder foil 19 and the heat sink block 4 is placed on the chip 1 through a solder foil 19. Thereafter, the solder foils 19 are melted by means of a heater (reflow device) and are then hardened.

Figure 5E:
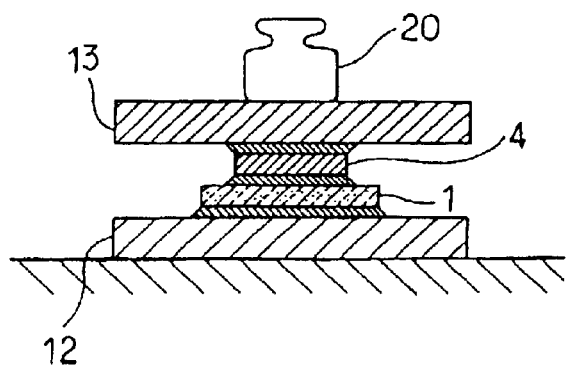
Figure 5C:
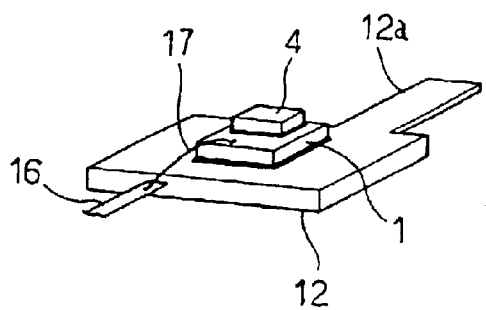

Then, as shown in FIG. 5C, the control electrode (e.g., gate electrode 15) of the chip 1 and the lead frame 16 are connected together by wire bonding for example. Next, as shown in FIGS. 5D and 5E, the upper heat sink 13 is connected and fixed onto the heat sink block 4. In this step, as shown in FIG. 5D, the upper heat sink 13 is placed on the heat sink block 4 through a solder foil 19. Then, the solder foil 19 is melted by the heater and is thereafter hardened. At this time, for example a weight 20 is placed on the upper heat sink 13 to press the upper heat sink downward. In addition, a spacer jig (not shown) is disposed between the upper heat sink 13 and the lower heat sink 12 to keep the distance between both heat sinks at a preset distance. Before melting of the solder foil 19, the distance between the upper and lower heat sinks 13, 12 is larger than the distance set by the spacer jig. Upon melting of the solder foil 19, the melted solder layer becomes thin under the pressing force of the weight 20 and the distance between both heat sinks 13 and 12 becomes equal to the distance set by the spacer jig. At this time, the thickness of the solder layer becomes a moderate thickness. The bonding and electrical connection among the semiconductor chip 1, heat sinks 12, 13 and heat sink block 4 are completed upon re-hardening of the melted solder layer.

Next, a polyamide resin is applied to the surfaces of the paired heat sinks 12 and 13 and also to peripheral portions (end face portions) of the semiconductor chip 1 and heat sink block 4. In this step there may be adopted, for example, a method in which the polyamide resin is added dropwise from a nozzle of a dispenser which is for the application of the polyamide resin, or a spray method for spraying the polyamide resin, or a dipping method. It is preferable that the polyamide resin be applied also to the surfaces of wire 17 and lead frame 16. The polyamide resin is dried and fixed.

Then, as shown in FIG. 4, the gap between the heat sinks 12 and 13 and the peripheral portions of the semiconductor chip 1 and the heat sink block 4 are molded with resin 18. In this step, the polyamide resin applicator is placed within a molding die (not shown) and the resin 18 is poured (filled), whereby the resin 18 is filled into the gap between the paired heat sinks 12 and 13 and also into the surrounding portions of the chip 1 and the heat sink block 4. After hardening of the resin 18, the semiconductor device 11 is taken out from the molding die.

Next, a consideration will be given below to an upper-limit value of the thickness t2 of the protective film 3.

Figure 7:
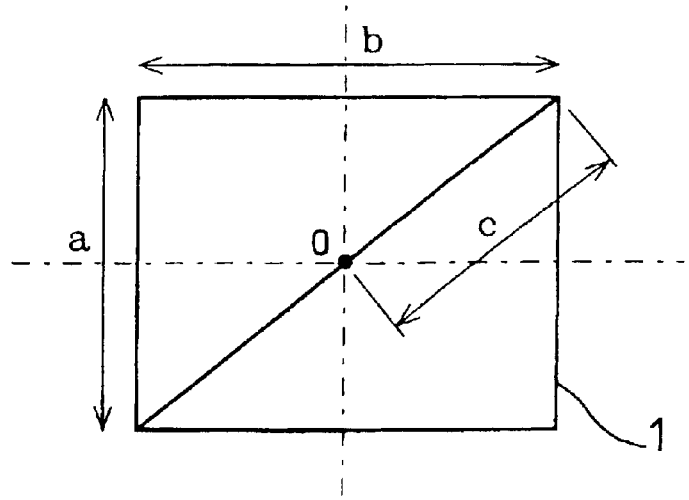
FIG. 7 is a schematic diagram for explaining a thermal stress acting on the semiconductor chip.

In the semiconductor chip 1 having a chip size of a×b, it is presumed that a thermal stress will act outwards from the center of the chip. Consequently, as shown in FIG. 7, with outward separation from the center O of the chip 1, the chip undergoes a larger strain. Therefore, a maximum strain point of the semiconductor chip 1 is presumed to be a point (vertex) spaced a half distance c of a diagonal line from the center O of the chip. For this reason, we have multiplied the distance c by both the absolute value of the difference in thermal expansion coefficient and the temperature difference ΔT in the working environment and used the resulting product as an upper-limit value of the thickness t2 of the protective film 3. In the above embodiment the heat sink block 4 is bonded using an Sn-based solder. In the above embodiment, moreover, parameters were set so as to establish the following relationship, in which a thermal expansion coefficient of the upper heat sink 13 as the heat sink located on the surface side of the semiconductor chip 1 is α1, that of the semiconductor chip 1 is α2, the size of the semiconductor chip 1 is a×b, and a temperature difference between highest and lowest temperatures in the working environment of the semiconductor device 11 is ΔT:

$$t1 < t2 \leq \frac{1}{2} \times \sqrt{a^2 + b^2} \times |\alpha 1 - \alpha 2| \times \Delta T$$

The following description is now provided about a method for accurately determining a lower-limit value of the thickness t2 of the protective film 3. In the above embodiment we have bonded the heat sinks and heat sink block with use of an Sn-based solder. Further, given that an apparent thermal expansion coefficient of the composite system comprising the heat sink 13 (incl. heat sink block 4) on the surface side of the semiconductor chip 1 and the solder 5 is α1e, that of the composite system comprising the back-side heat sink 12 of the semiconductor chip 1 and the semiconductor chip is α2e, the size of the semiconductor chip 1 is a×b, and a temperature difference between highest and lowest temperatures in the working environment is ΔT, we have set parameters so that the following relationship is established:

$$\frac{1}{2} \times \sqrt{a^2 + b^2} \times |\alpha 1e - \alpha 2e| \times \Delta T \leq t2$$

When the heat sink 13, heat sink block 4 and solder 5 are regarded as a single member, the apparent thermal expansion coefficient α1e of the composite system comprising the heat sink 13 on the surface side of the semiconductor chip 1 and the solder 5 means a thermal expansion coefficient of the single member. This thermal expansion coefficient can be obtained by calculation (simulation) or experiment (actual measurement). Also as to the apparent thermal expansion coefficient α2e of the composite system comprising the heat sink 12 on the back side of the semiconductor chip 1 and the semiconductor chip, it can be obtained in the same manner.

Therefore, parameters of various components such as the thickness t1 of the wiring layer 2 and the thickness t2 of the protective film were selected so that the following relationship is established:

$$t1 < \frac{1}{2} \times \sqrt{a^2 + b^2} \times |\alpha 1e - \alpha 2e| \times \Delta T \leq$$

$$t2 \leq \frac{1}{2} \times \sqrt{a^2 + b^2} \times |\alpha 1 - \alpha 2| \times \Delta T$$

Having made trial manufacture and experiment we confirmed that by satisfying the above relationship it was possible to prevent a short-circuit defect of the wiring layer 2 in a substantially positive manner even under the application of a large thermal stress.

Figure 8:
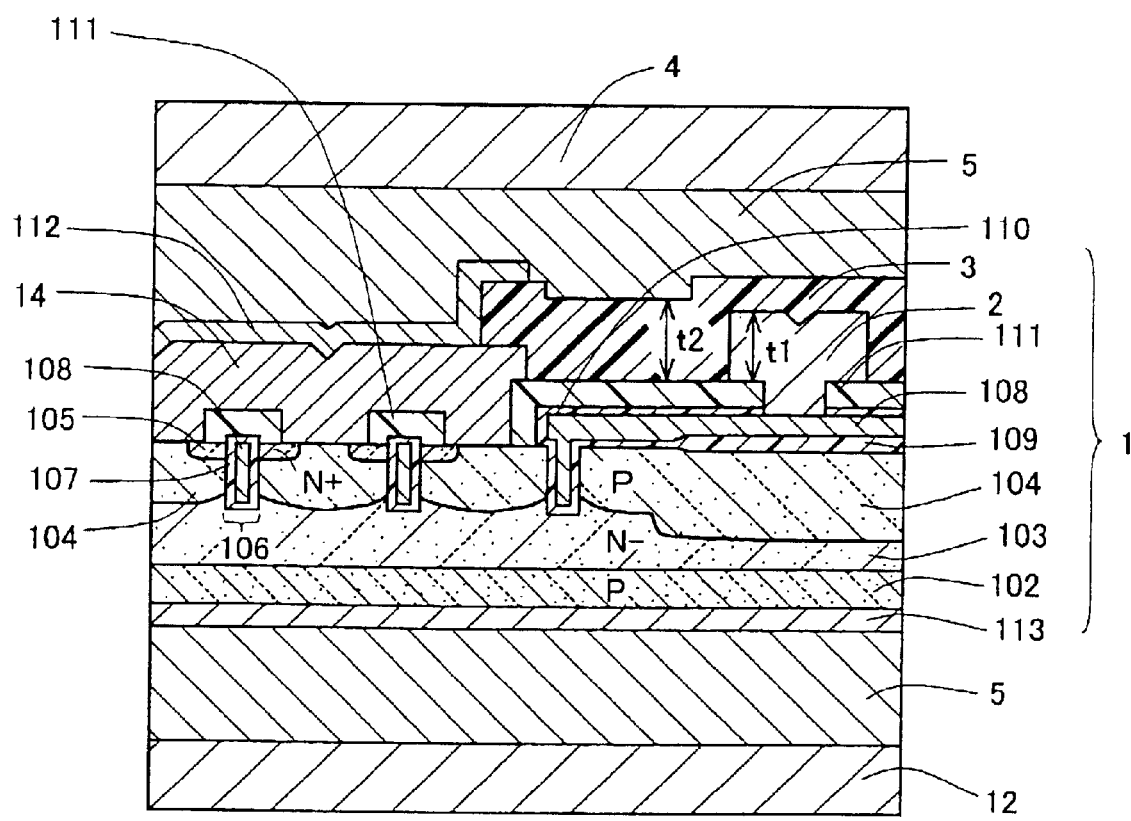
FIG. 8 is a vertical sectional view showing the details of the semiconductor device according to the first embodiment.

Next, with reference to FIG. 8, a description will be given of the semiconductor element 1 in the above embodiment. FIG. 8, which corresponds to FIG. 1, shows an internal structure of the semiconductor element 1 in more detail. Bonding between the lower heat sink 12 and the heat sink block 4 is also illustrated in FIG. 8.

Both upper and lower surfaces of the semiconductor element (semiconductor chip) 1 are held grippingly by the heat sink block 4 and the lower heat sink 12, respectively, and are bonded to the heat sink block and the lower heat sink through layers 5, 5 of an electrically conductive bonding material (solder). This is not only for realizing electrical connections over a wide area on both surfaces of the semiconductor element but also for making the radiation of heat from both surfaces possible to enhance the heat radiating efficiency.

Emitter electrodes 14 and wiring layer (gate runner) 2 are present under the conductive bonding material formed on the surface side of the semiconductor device 1. The wiring layer 2 is insulated from the bonding material 5 through only the protective film (polyimide film) 3.

The semiconductor element 1 has what is called a pnpn substrate structure. More specifically, the semiconductor element 1 has a p collector layer 102, an n⁻ drift layer 103 epitaxially grown on the p collector layer 102, a p layer 104 formed on the n⁻ drift layer 103 and serving as a channel and a body, and an n⁺ emitter region 105 formed in the p layer 104. A trench 106 is formed so as to extend through the p layer 104, with a gate insulating film 107 and a polycrystalline Si gate layer 108 being embedded within the trench 106. An emitter electrode 14 made of aluminum is formed so as to make contact with both emitter region 105 and p layer 104. At this time, the emitter electrode 14 and the polycrystalline Si gate layer 108 are insulated by an inter-layer insulating film 111. The polycrystalline Si gate layer 108 is extended so as to be drawn out on a LOCOS film 109. Above the LOCOS film 109, a polycrystalline Si oxide film 110 and the inter-layer insulating film 111, which overlie the polycrystalline Si gate layer 108, are partially removed and the wiring layer 2 formed of aluminum is in contact with the polycrystalline Si gate layer 108 through the removed portion. The wiring layer 2 and the emitter electrode 14 are formed by etching a simultaneously-deposited Al film to effect patterning. The protective film 3, which is an organic film, is formed at the thickness t2 for the purpose of protecting the wiring layer 2.

In the figure, a peripheral edge portion of the wiring layer 2 is put on the inter-layer insulating film 111, and when the difference in height from the surface of the inter-layer insulating film 111 to the surface of the wiring layer 2 is assumed to be t1 and the height from the surface of the inter-layer insulating film 111 to the surface of the protective film 3 is assumed to be t2, the wiring layer 2 and the protective film 3 are formed so as to establish the relationship of t1<t2 as noted previously.

Figure 9:
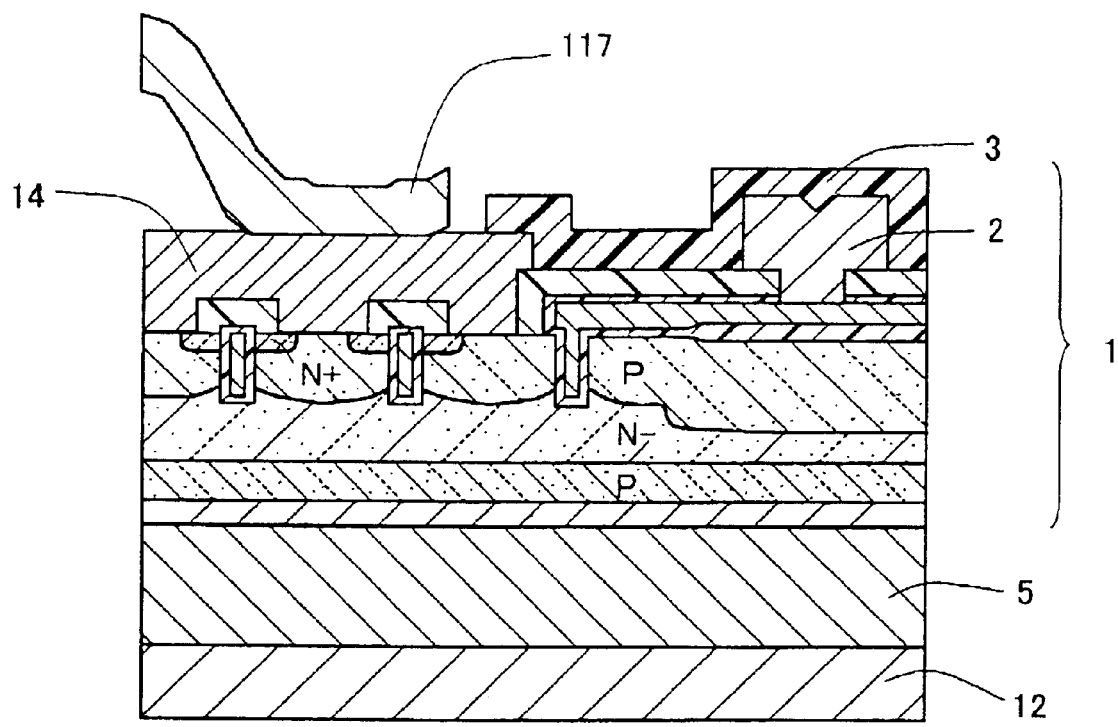
FIG. 9 is a vertical sectional view of a semiconductor device according to a comparative example.

FIG. 9 illustrates a conventional structure in which the connection of an emitter electrode to an emitter terminal is made by wire bonding with use of wire 117. In this conventional structure (FIG. 9), an electrically conductive material is not present throughout the whole surface of the semiconductor element 1, so there is no cause of short-circuit between the wiring layer 2 such as gate runner and the emitter electrode 14. Thus, even if the protective layer 3 is provided, its function may be only the protection against human errors or the like. For this reason, it suffices for the protective film 3 to have such a thickness as can maintain insulation.

On the other hand, in this embodiment (FIG. 8), since a layer of the same potential as the emitter electrode 14, i.e., bonding material 5, is present near the wiring layer 2, it is necessary to consider protection against a large external force, and a through study is needed about the thickness of the protective layer 3, as noted previously.

In FIG. 8, between the emitter electrode 14 and the bonding material 5 is provided a bonding electrode 112 which is formed by sputtering of Ti, Ni, and Au successively from the emitter electrode side. The bonding electrode 12 is for ensuring a sufficient bonding force between the emitter electrode 14 and the bonding material 5. If a sufficient bonding force can be obtained, the bonding electrode 112 may be omitted. On the back side of the semiconductor element 1 is formed a back electrode 113 as a collector electrode. The back electrode 113 can also be formed by depositing Ti, Ni, and Au successively from the p collector layer 102 side in accordance with the sputtering technique.

Figure 10:
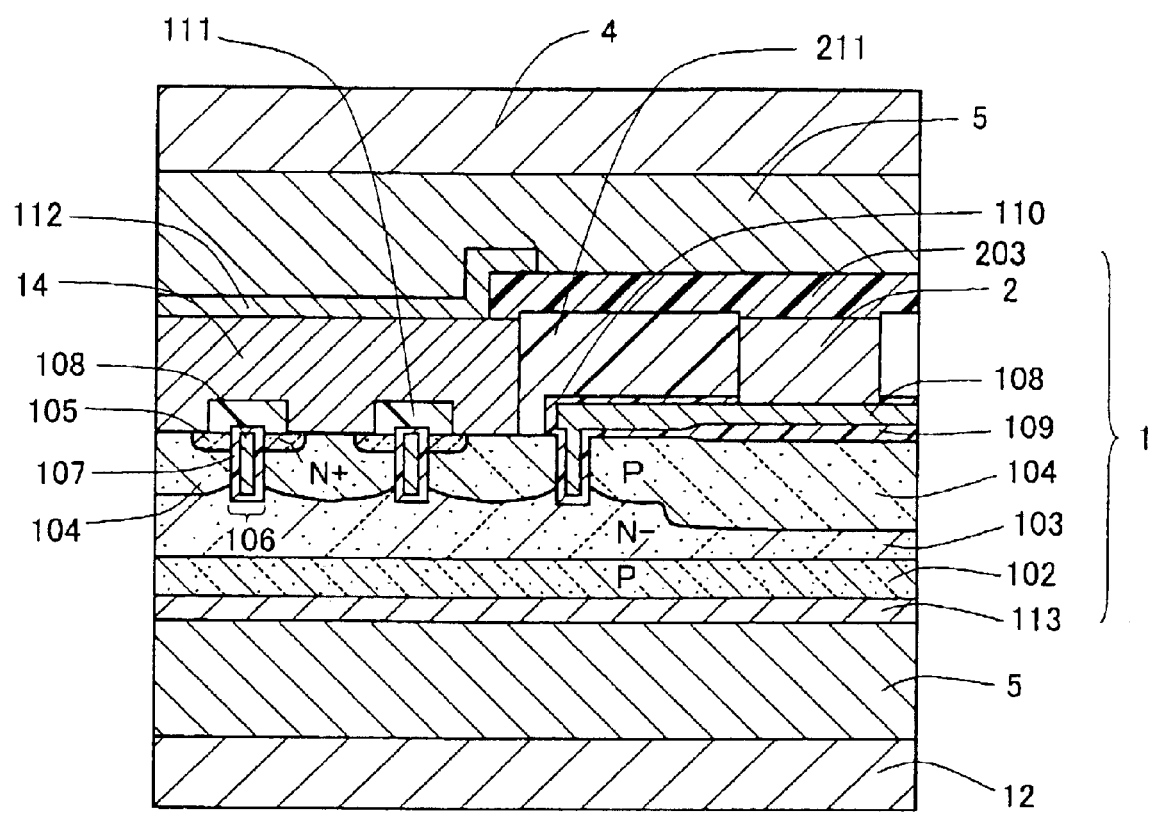
FIG. 10 is a vertical sectional view showing the details of a semiconductor device according to a second embodiment of the present invention.

A second embodiment of the present invention will now be described. FIG. 10 illustrates the second embodiment, in which the same portions as in FIG. 8 are identified by like reference numerals. According to the structure of this embodiment, an inter-layer insulating film 211 is formed thick so that the wiring layer 2 is not exposed to the top surface. That is, the wiring layer 2 is formed so as to be flat or concave with respect to the surface positioned near the wiring layer (the surface of the inter-layer insulating film 211), whereby a surface asperity of the protective film 203 serving as the ground for the bonding material 5 in the region above the wiring layer becomes flat or is concave above the wiring layer. As a result, even if a large thermal stress is induced due to a difference in thermal expansion coefficient between the semiconductor element and the heat sink block, it is possible to prevent a short-circuit defect of the wiring layer in a substantially positive manner. It suffices for the protective film to have a thickness which can ensure insulation. The inter-layer insulating film 211, wiring layer 2 and emitter electrode 14 can be formed by the damascene method.

A third embodiment of the present invention will now be described with reference to FIG. 11, in which the same portions as in FIG. 8 are identified by like reference numerals. In this embodiment, the whole of the surface of the semiconductor element, i.e., the whole of the bonding interface between the semiconductor element and the bonding material 5, is covered with an emitter electrode 314 so that concave and convex caused by the wiring layer 2 are not present on the interface. The emitter electrode 314 corresponds to a second electrode on the semiconductor element. Also with this structure it is possible to solve the foregoing problem.

Figure 11:
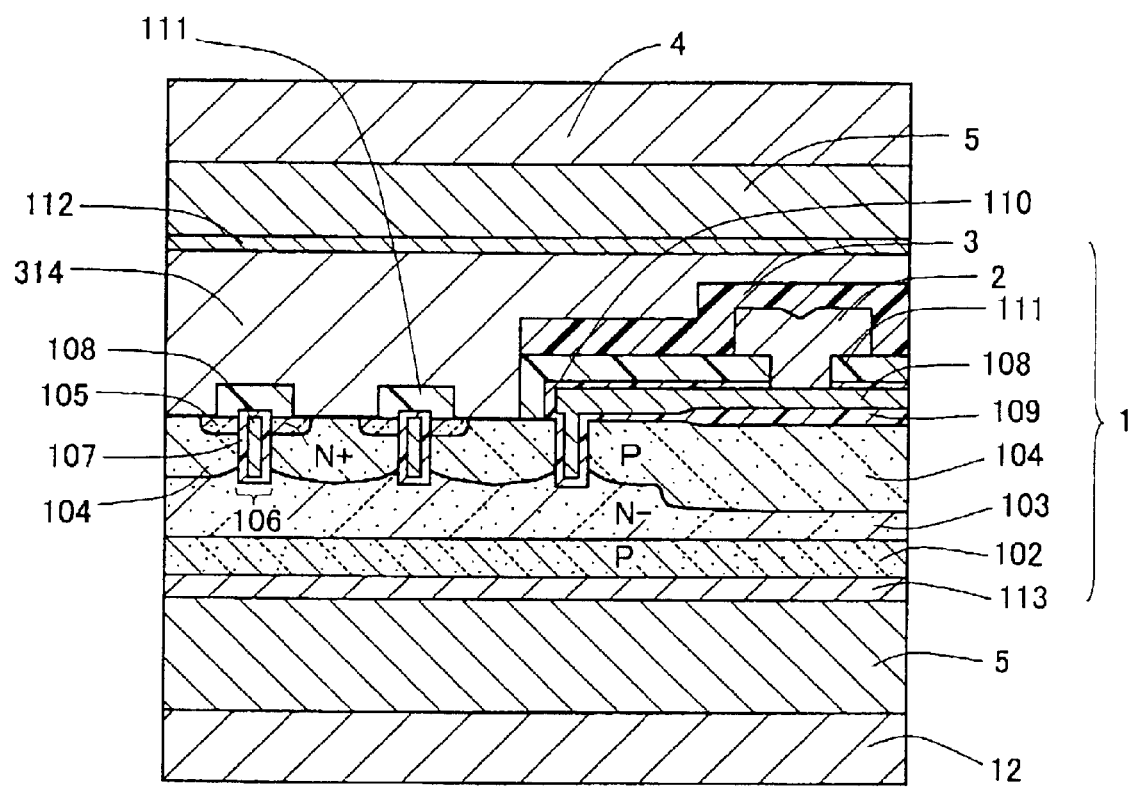
FIG. 11 is a vertical sectional view showing the details of a semiconductor device according to a third embodiment of the present invention.

Although in the embodiments illustrated in FIGS. 8, 10 and 11 there is adopted a trench gate as the structure of gate, the present invention is not limited to the semiconductor element having a trench gate. Moreover, although there is illustrated a structure applied to an n-channel IGBT as the semiconductor chip 1, the type of the chip is not limited thereto. For example, the present invention may be applied to MOSFET or any other semiconductor element. In a construction applied to a vertical MOSFET the emitter electrode 14 becomes a source electrode and the collector electrode becomes a drain electrode.

The semiconductor element 1 may be formed in, for example, Si, SiC, or GaAs. In FIGS. 8, 10 and 11, the gate insulating film 107 may be, for example, a single silicon oxide layer or a multi-layer of silicon oxide and silicon nitride. As the emitter electrode and wiring layer there may be adopted various conductors in addition to Al. Also as to the back electrode, there may be adopted not only the multi-layer film of Ti/Ni/Au but also a film structure containing Cr for example. As the bonding material there may be adopted, for example, an Sn-based solder such as Sn-3.5 Ag or Ag paste. As the heat sink, for example Cu or Al is suitable, but there also may be used other metals such as invar and molybdenum.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defined in the appended claims.

What is claimed is:

1. A semiconductor device comprising:

a semiconductor element;

a first electrode layer formed on one main surface side of the semiconductor element;

a second electrode layer formed on the one main surface side of the semiconductor element to be spaced from the first electrode layer;

an electrically conductive bonding material having a region in contact with the second electrode layer and also having a region overlapping the first electrode layer;

an organic protective film, the protective film being disposed between the first electrode layer and the bonding material so as to cover the first electrode layer in the region where the first electrode layer and the bonding material overlap each other, thereby preventing contact of the first electrode layer with the bonding material; and first metal blocks bonded electrically to the second electrode layer through the bonding material;

wherein the thickness of the first electrode layer at a peripheral edge portion of the first electrode layer is t1 and a thickness of the protective film around the first electrode layer in a peripheral region is t2, there exists the following relationship:

t1<t2, and wherein the bonding material is a Sn-based solder, and given that a thermal expansion coefficient of the first metal block is $\alpha 1$, that of the semiconductor element is $\alpha 2$, a chip size of the semiconductor element is a×b, and a temperature difference between highest and lowest temperatures in a working environment is $\Delta T$, there exists the following relationship:

$$t1 < t2 \le \frac{1}{2} \times \sqrt{a^2 + b^2} \times |\alpha 1 - \alpha 2| \times \Delta T.$$

2. A semiconductor device according to claim 1, further comprising a second metal block which is bonded to another main surface side of the semiconductor element through a bonding material.

3. A semiconductor device according to claim 2, wherein the bonding material is a Sn-based solder, and given that a thermal expansion coefficient of a composite system comprising the first metal blocks disposed on the one main surface side of the semiconductor element and the Sn-based solder is $\alpha 1e$, an apparent thermal expansion coefficient of a composite system comprising the second metal block disposed on the another main surface side of the semiconductor element and the semiconductor element is $\alpha 2e$, a chip size of the semiconductor element is a×b, and a temperature difference between highest and lowest temperatures in a working environment is $\Delta T$, there exists the following relationship:

$$\frac{1}{2} \times \sqrt{a^2 + b^2} \times |\alpha 1e - \alpha 2e| \times \Delta T \le t2.$$

4. A semiconductor device according to claim 2, wherein the semiconductor element is a vertical power semiconductor element, the first metal block constitutes a first terminal of the power semiconductor element, the second metal block constitutes a second terminal of the power semiconductor element, and the first electrode layer constitutes a control wiring of the power semiconductor element.

5. A semiconductor device according to claim 2, wherein the semiconductor element, the first metal blocks and the second metal block are integrally sealed with resin.

6. A semiconductor device according to claim 1, wherein the protective film is a polyimide film.

7. A semiconductor device comprising:

a semiconductor element;

a first electrode layer formed on one main surface side of the semiconductor element;

a second electrode layer formed on the one main surface side of the semiconductor element to be spaced from the first electrode layer;

an electrically conductive first bonding material having a region in contact with the second electrode layer and also having a region overlapping the first electrode layer;

an organic protective film, the protective film being disposed between the first electrode layer and the first bonding material so as to cover the first electrode layer in the region where the first electrode layer and the first bonding material overlap each other, thereby preventing contact of the first electrode layer with the first bonding material;

first metal blocks bonded electrically to the second electrode layer through the first bonding material; and a second metal block which is bonded to another main surface side of the semiconductor element through a second bonding material, wherein the thickness of the first electrode layer at a peripheral edge portion of the first electrode layer is t1 and a thickness of the first protective film around the first electrode layer in a peripheral region is t2, there exists the following relationship:

t1<t2, and wherein the first and second bonding materials are a Sn-based solder, and given that a thermal expansion coefficient of a composite system comprising the first metal blocks disposed on the one main surface side of the semiconductor element and the Sn-based solder is $\alpha 1e$, a thermal expansion coefficient of a composite system comprising the second metal block disposed on the another main surface side of the semiconductor element and the semiconductor element is $\alpha 2e$, a chip size of the semiconductor element is a×b, and a temperature difference between highest and lowest temperatures in a working environment is ΔT, there exists the following relationship:

$$\frac{1}{2} \times \sqrt{a^2 + b^2} \times |\alpha 1e - \alpha 2e| \times \Delta T \leq t2.$$

8. A semiconductor device according to claim 7, wherein the semiconductor element is a vertical power semiconductor element, the first metal block constitutes a first terminal of the power semiconductor element, the second metal block constitutes a second terminal of the power semiconductor element, and the first electrode layer constitutes a control wiring of the power semiconductor element.

9. A semiconductor device according to claim 7, wherein the semiconductor element, the first metal blocks and the second metal block are integrally sealed with resin.

10. A semiconductor device according to claim 7, wherein the protective film is a polyimide film.

11. A semiconductor device comprising:
a semiconductor element;
a first electrode layer having a top surface, the first electrode layer formed on one main surface side of the semiconductor element;
an organic insulating protective film which covers the first electrode layer so as to straddle one region of the first electrode layer and having substantially uniform thickness in the one region of the first electrode layer including a peripheral portion; and
an electrically conductive bonding material which overlaps an upper surface of the one region of the first electrode layer through the protective film,
wherein the thickness of the top surface of the first electrode layer with respect to a peripheral portion of the first electrode layer is t1 and the thickness of the protective film with respect to the peripheral portion of the first electrode layer is t2, there exists the following relationship:
t1<t2, and
wherein the protective film is constructed so as to have an elastic modulus smaller than that of the bonding material and have a thermal expansion coefficient almost equal to that of the bonding material.

12. A semiconductor device according to claim 11, wherein the protective film is constructed so as to have an elastic modulus at room temperature of 1.0–5.0 GPa and a thermal expansion coefficient of 35–65×10⁻⁶/° C.

13. A semiconductor device according to claim 11, wherein the bonding material is solder.

14. A semiconductor device according to claim 11, wherein the protective film is a polyimide film.

15. A semiconductor device comprising:
a semiconductor element;
a first electrode layer formed on one main surface side of the semiconductor element;
a second electrode layer formed on the one main surface side of the semiconductor element to be spaced from the first electrode layer;
an electrically conductive bonding material having a region in contact with the second electrode layer and also having a region overlapping the first electrode layer;
an organic protective film, the protective film being disposed between the first electrode layer and the bonding material so as to cover the first electrode layer in the region where the first electrode layer and the bonding material overlap each other, thereby preventing contact of the first electrode layer with the bonding material; and
first metal blocks bonded electrically to the second electrode layer through the bonding material;
wherein the thickness of the first electrode layer at a peripheral edge portion of the first electrode layer is t1 and a thickness of the protective film around the first electrode layer in a peripheral region is t2, there exists the following relationship:
t1<t2, and
wherein the protective film is constructed so as to have an elastic modulus smaller than that of the bonding material and have a thermal expansion coefficient almost equal to that of the bonding material.

16. A semiconductor device according to claim 15, wherein the protective film is constructed so as to have an elastic modulus at room temperature of 1.0–5.0 GPa and a thermal expansion coefficient of 35–65×10⁻⁶/° C.

17. A semiconductor device according to claim 15, wherein the bonding material is solder.

18. A semiconductor device according to claim 15, wherein the protective film is a polyimide film.

19. A semiconductor device, comprising:
a semiconductor element;
heat sinks soldered to both surfaces of the semiconductor element;
a wiring layer formed on a surface of the semiconductor element; and
an organic protective film formed so as to cover the wiring layer,
wherein if the thickness of the wiring layer and that of the protective film are t1 and t2, respectively, there exists a relationship of t1<t2, and
the protective film is constructed so as to have an elastic modulus at room temperature of 1.0–5.0 GPa and a thermal expansion coefficient of 35–65×10⁻⁶/° C., and
wherein the soldering is performed using a Sn-based solder, and given that a thermal expansion coefficient of the heat sinks located on the surface side of the semiconductor element is α1, a thermal expansion coefficient of the semiconductor element is α2, a chip size of the semiconductor element is a×b, and a temperature difference between highest and lowest temperatures in a working environment is ΔT, there exists the following relationship:

$$t1 < t2 \leq \frac{1}{2} \times \sqrt{a^2 + b^2} \times |\alpha 1 - \alpha 2| \times \Delta T.$$

20. A semiconductor device according to claim 19, wherein the protective film is a polyimide film.

21. A semiconductor device comprising:
a semiconductor element;
heat sinks soldered to both surfaces of the semiconductor element;
a wiring layer formed on a surface of the semiconductor element; and
an organic protective film formed so as to cover the wiring layer,
wherein the thickness of the wiring layer and that of the protective film are t1 and t2, respectively, there exists a relationship of t1<t2, and the protective film is constructed so as to have an elastic modulus at room temperature of 1.0–5.0 GPa and a thermal expansion coefficient of 35–65×10⁻⁶/° C., and wherein the soldering is performed using a Sn-based solder, and given that a thermal expansion coefficient of a composite system comprising the heat sinks located on the surface side of the semiconductor element and the solder is α1e, an apparent thermal expansion coefficient of a composite system comprising the heat sink located on a back side of the semiconductor element is α2e, a chip size of the semiconductor element is a×b, and a temperature difference between highest and lowest temperatures in a working environment is ΔT, there exists the following relationship:

$$\frac{1}{2} \times \sqrt{a^2 + b^2} \times |\alpha 1e - \alpha 2e| \times \Delta T \leq t2.$$

22. A semiconductor device according to claim 21, wherein the protective film is a polyimide film.

23. A semiconductor device comprising:
a first electrode layer formed on one main surface side of the semiconductor element;
a second electrode layer formed on the one main surface side of the semiconductor element to be spaced from the first electrode layer;
an insulating protective film which covers the first electrode layer;
an electrically conductive first bonding material having a region in contact with the second electrode layer and also having a region overlapping the first electrode layer; and
a first metal block bonded electrically to the second electrode layer through the first bonding material,
wherein a surface topography of a base for the first bonding material in the region overlapping the first electrode layer is flat or makes a level of the surface of the first electrode layer lower than a level of the surface of a base neighboring the first electrode layer, and
wherein the insulating protective film is constructed so as to have an elastic modulus smaller than that of the electrically conductive first bonding material and have a thermal expansion coefficient almost equal to that of the electrically conductive first bonding material.

24. A semiconductor device according to claim 23, wherein the first electrode layer is formed in a flat or concave shape with respect to a surface of a vicinity of the first electrode layer.

25. A semiconductor device according to claim 23, further comprising a second metal block which is bonded to another main surface side of the semiconductor element through a second bonding material.

26. A semiconductor device according to claim 23, wherein the semiconductor element is a vertical power semiconductor element, the first metal block constitutes a first terminal of the power semiconductor element, the second metal block constitutes a second terminal of the power semiconductor element, and the first electrode layer constitutes a control wiring of the power semiconductor element.

27. A semiconductor device according to claim 23, wherein the semiconductor element, the first metal blocks and the second metal block are integrally sealed with resin.

28. A semiconductor device according to claim 23, wherein the first bonding material is solder.

29. A semiconductor device according to claim 23, wherein the protective film is constructed so as to have an elastic modulus at room temperature of 1.0–5.0 GPa and a thermal expansion coefficient of 35–65×10⁻⁶/° C.

30. A semiconductor device according to claim 23, wherein the protective film is a polyimide film.

31. A semiconductor device comprising:
a semiconductor element;
a first electrode layer formed on one main surface side of the semiconductor element;
a second electrode layer formed on the one main surface side of the semiconductor element to be spaced from the first electrode layer;
an insulating protective film which covers the first electrode layer;
an electrically conductive bonding material having a region in contact with the second electrode layer and also having a region overlapping the first electrode layer; and
a first metal block bonded electrically to the second electrode layer through the bonding material,
wherein a surface topography of a base for the bonding material in the region overlapping the first electrode layer is flat or makes a level of the surface of the first electrode layer lower than a level of the surface of a base neighboring the first electrode layer, and
wherein the second electrode layer is disposed below the region of the bonding material overlapping the first electrode layer and above the first electrode layer through the protective film, and a surface of the second electrode layer constitutes the base for the bonding material.

32. A semiconductor device according to claim 31, wherein the protective film has an organic protective film formed on a surface of the first electrode layer.

33. A semiconductor device comprising:
a semiconductor element having:
a first electrode layer formed on one main surface side of the semiconductor element; and
a second electrode layer formed on the one main surface side of the semiconductor element to be spaced from the first electrode layer;
an insulating protective film which covers the first electrode layer so as to straddle one region of the first electrode layer; and
an electrically conductive material having a region in contact with the second electrode layer and also having a region overlapping the first electrode layer through the protective film,
wherein the thickness of the top surface of the first electrode layer with respect to a peripheral portion of the first electrode layer is t1 and the thickness of the protective film with respect to the peripheral portion of the first electrode is t2, there exists the following relationship: t1<t2, and
wherein the protective film is constructed so as to have an elastic modulus smaller than that of the conductive material and have a thermal expansion coefficient almost equal to that of the conductive material.

34. A semiconductor device according to claim 33, wherein the conductive material is solder.

35. A semiconductor device according to claim 33, wherein the protective film is constructed so as to have an elastic modulus at room temperature of 1.0–5.0 GPa and a thermal expansion coefficient of 35–65×10⁻⁶/degree C.

36. A semiconductor device according to claim 33, wherein the protective film is a polyimide film.

37. A semiconductor device according to claim 33, wherein the semiconductor element is a vertical power semiconductor element, the second electrode layer constitutes a first terminal of the power semiconductor element, a third electrode layer formed on a rear surface constitutes a second terminal of the power semiconductor element, and the first electrode layer constitutes a gate runner of the power semiconductor element.

38. A semiconductor device according to claim 33, wherein the semiconductor element, the protective film and the conductive material are integrally sealed with resin.

* * * * *